United States Patent
Mu et al.

(10) Patent No.: US 9,755,616 B2
(45) Date of Patent: Sep. 5, 2017

(54) METHOD AND APPARATUS FOR DATA FILTERING, AND METHOD AND APPARATUS FOR CONSTRUCTING DATA FILTER

(71) Applicant: Huawei Technologies Co., Ltd., Shenzhen (CN)

(72) Inventors: Yadong Mu, Shenzhen (CN); Wei Fan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/391,122

(22) Filed: Dec. 27, 2016

(65) Prior Publication Data

US 2017/0111030 A1    Apr. 20, 2017

Related U.S. Application Data

(63) Continuation of application No. PCT/CN2015/080743, filed on Jun. 4, 2015.

(30) Foreign Application Priority Data

Jun. 30, 2014    (CN) .......................... 2014 1 0305277

(51) Int. Cl.
  *G06F 17/10*    (2006.01)
  *H03H 17/02*    (2006.01)
(52) U.S. Cl.
  CPC .............................. *H03H 17/0248* (2013.01)
(58) Field of Classification Search
  CPC ................................................. H03H 17/0248
  USPC ................................................. 708/300–323
  See application file for complete search history.

(56) References Cited

U.S. PATENT DOCUMENTS 5,537,443 A *  7/1996  Yoshino et al. .............. 375/340
8,375,450 B1   2/2013  Oliver et al.

FOREIGN PATENT DOCUMENTS

| CN | 1403959 A | 3/2003 |
|---|---|---|
| CN | 1922837 A | 2/2007 |
| CN | 101594313 A | 12/2009 |

(Continued)

OTHER PUBLICATIONS

Machine Translation and Abstract of Chinese Publication No. CN101594313, Dec. 2, 2009, 9 pages.

(Continued)

*Primary Examiner* — Tan V. Mai
(74) *Attorney, Agent, or Firm* — Conley Rose, P.C.

(57) ABSTRACT

A method for data filtering includes segmenting a to-be-detected vector to obtain k to-be-detected sub-vectors, respectively performing an inner product operation on the k to-be-detected sub-vectors and corresponding detection vectors among preset k detection vectors to obtain k first operation results, determining a first operation result whose value is the maximum among the k first operation results and obtaining an identifier of a detection vector corresponding to the first operation result, where a detection vector is in a one-to-one correspondence to an identifier, and mapping the to-be-detected vector to a preset data filter according to the obtained identifier of the detection vector corresponding to the first operation result whose value is the maximum, and determining, using the data filter, whether to filter out the to-be-detected vector.

20 Claims, 3 Drawing Sheets

(56) References Cited

FOREIGN PATENT DOCUMENTS

| | | |
|---|---|---|
| CN | 101814086 A | 8/2010 |
| CN | 102110122 A | 6/2011 |
| CN | 102521402 A | 6/2012 |
| CN | 102622366 A | 8/2012 |
| CN | 102915347 A | 2/2013 |
| CN | 102945244 A | 2/2013 |
| CN | 103034726 A | 4/2013 |
| CN | 103037339 A | 4/2013 |
| CN | 103226576 A | 7/2013 |
| CN | 103257992 A | 8/2013 |
| WO | 2013017306 A1 | 2/2013 |

OTHER PUBLICATIONS

Machine Translation and Abstract of Chinese Publication No. CN101814086, Aug. 25, 2010, 16 pages.
Machine Translation and Abstract of Chinese Publication No. CN102521402, Jun. 27, 2012, 6 pages.
Machine Translation and Abstract of Chinese Publication No. CN102945244, Feb. 27, 2013, 17 pages.
Machine Translation and Abstract of Chinese Publication No. CN103034726, Apr. 10, 2013, 8 pages.
Machine Translation and Abstract of Chinese Publication No. CN103037339, Apr. 10, 2013, 6 pages.
Machine Translation and Abstract of Chinese Publication No. CN103226576, Jul. 31, 2013, 6 pages.
Foreign Communication From a Counterpart Application, PCT Application No. PCT/CN2015/080743, English Translation of International Search Report dated Aug. 20, 2015, 2 pages.
Foreign Communication From a Counterpart Application, PCT Application No. PCT/CN2015/080743, English Translation of Written Opinion dated Aug. 19, 2015, 5 pages.

* cited by examiner

METHOD AND APPARATUS FOR DATA FILTERING, AND METHOD AND APPARATUS FOR CONSTRUCTING DATA FILTER

CROSS-REFERENCE TO RELATED APPLICATIONS

This application is a continuation of International Application No. PCT/CN2015/080743, filed on Jun. 4, 2015, which claims priority to Chinese Patent Application No. 201410305277.5, filed on Jun. 30, 2014. The disclosures of the aforementioned applications are hereby incorporated by reference in their entireties.

TECHNICAL FIELD

The present disclosure relates to the communications field, and in particular, to a method and an apparatus for data filtering, and a method and an apparatus for constructing a data filter.

BACKGROUND

Stream data may be considered as a dynamic data set that infinitely increases as the time passes. Data filtering is also referred to as data filtration, and an objective of the data filtering is to identify qualified data according to a rule that is set in advance, and intercept or discard the data. Data filtering is an importance operation in stream data processing. For example, for some web sites for sharing Internet videos, videos continually submitted by users constitute a large scale of video stream data. Within an extremely short time, a system needs to complete operations such as analyzing, filtering, indexing, and storage on the video stream data, and filters out an unqualified data stream. For another example, for emails, laboratory data indicates that, in 2012, junk mails account for 72.1 percent (%) of all emails on average. Therefore, to ensure service quality, an Internet email service provider needs to filter out a junk mail from an email stream.

For a problem of how to perform data filtering, in the prior art, generally multiple pieces of detection data are preset, and when data needs to be detected, a similarity between data is determined in a manner similar to string matching, and if a similarity between the to-be-detected data and one or more pieces of detection data thereof is relatively high, it is determined that the to-be-detected data needs to be removed.

A disadvantage of the method is that a similarity between data can be determined only in a manner similar to string matching, and therefore data that has complex semantics cannot be processed.

SUMMARY

Embodiments of the present disclosure provide a method and an apparatus for data filtering, and a method and an apparatus for constructing a data filter to resolve a technical problem that there is no desirable method for data filtering in the prior art.

According to a first aspect of the present disclosure, a method for data filtering is provided, including segmenting a to-be-detected vector to obtain k to-be-detected sub-vectors, respectively performing an inner product operation on the k to-be-detected sub-vectors and corresponding detection vectors among preset k detection vectors to obtain k first operation results, determining a first operation result whose value is the maximum among the k first operation results and obtaining an identifier of a detection vector corresponding to the first operation result, where a detection vector is in a one-to-one correspondence to an identifier, and mapping the to-be-detected vector to a preset data filter according to the obtained identifier of the detection vector corresponding to the first operation result whose value is the maximum, and determining, using the data filter, whether to filter out the to-be-detected vector.

With reference to the first aspect, in a first possible implementation manner of the first aspect, after the segmenting a to-be-detected vector to obtain k to-be-detected sub-vectors, the method further includes respectively performing a normalization operation on the k to-be-detected sub-vectors, and the respectively performing an inner product operation on the k to-be-detected sub-vectors and corresponding detection vectors among preset k detection vectors to obtain k first operation results includes respectively performing the inner product operation on the k to-be-detected sub-vectors after the normalization operation and the corresponding detection vectors among the k detection vectors to obtain the k first operation results.

With reference to the first aspect or the first possible implementation manner of the first aspect, in a second possible implementation manner of the first aspect, before the segmenting a to-be-detected vector to obtain k to-be-detected sub-vectors, the method further includes constructing the data filter.

With reference to the second possible implementation manner of the first aspect, in a third possible implementation manner of the first aspect, the constructing the data filter includes taking N sample vectors, and performing the following steps for each sample vector of the N sample vectors segmenting the sample vector to obtain k sample sub-vectors, respectively performing an inner product operation on the k sample sub-vectors and corresponding detection vectors among the preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, and an identifier of a detection vector is in a one-to-one correspondence to a hash bucket, after the mapping of the N sample vectors is completed, respectively obtaining values of the k hash buckets to determine, according to a value of a corresponding hash bucket, whether to filter out the to-be-detected vector, where a value of each hash bucket is a total quantity of sample vectors that are mapped to the hash bucket, and determining that the construction of the data filter is completed, where the data filter includes the k detection vectors, and the k hash buckets that respectively correspond to values of corresponding hash buckets.

With reference to the third possible implementation manner of the first aspect, in a fourth possible implementation manner of the first aspect, the mapping the to-be-detected vector to a preset data filter according to the obtained identifier of the detection vector corresponding to the first operation result whose value is the maximum, and determining, using the data filter, whether to filter out the to-be-detected vector includes mapping the to-be-detected vector to a particular hash bucket, and determining whether a value of the particular hash bucket is greater than a preset threshold, where the particular hash bucket is a hash bucket that is in the data filter and that corresponds to the identifier of the detection vector corresponding to the first operation result whose value is the maximum, and if the value of the particular hash bucket is greater than the preset threshold, determining to filter out the to-be-detected vector.

With reference to the third possible implementation manner or the fourth possible implementation manner of the first aspect, in a fifth possible implementation manner of the first aspect, before the segmenting the sample vector to obtain k sample sub-vectors, the method further includes obtaining the k detection vectors from a particular distribution, and respectively performing a normalization operation on the k detection vectors such that L2 norms, or Euclidean distance, of the k detection vectors are 1, where the particular distribution meets that after a normalization operation is performed on any vector obtained from the particular distribution, an L2 norm of the any vector is 1.

With reference to the third possible implementation manner, the fourth possible implementation manner, or the fifth possible implementation manner of the first aspect, in a sixth possible implementation manner of the first aspect, after the k sample sub-vectors are obtained, the method further includes respectively performing a normalization operation on the k sample sub-vectors, and the respectively performing an inner product operation on the k sample sub-vectors and corresponding detection vectors among the preset k detection vectors to obtain k second operation results includes respectively performing the inner product operation on the k sample sub-vectors after the normalization operation and the corresponding detection vectors among the k detection vectors to obtain the k second operation results.

According to a second aspect of the present disclosure, a method for constructing a data filter is provided, including taking N sample vectors, and performing the following steps for each sample vector of the N sample vectors segmenting the sample vector to obtain k sample sub-vectors, respectively performing an inner product operation on the k sample sub-vectors and corresponding detection vectors among preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, each detection vector corresponds to one identifier, a detection vector is in a one-to-one correspondence to an identifier, and an identifier of a detection vector is also in a one-to-one correspondence to a hash bucket, after the mapping of the N sample vectors is completed, respectively obtaining values of the k hash buckets to determine, according to a value of a corresponding hash bucket, whether to filter out the to-be-detected vector, where a value of each hash bucket is a total quantity of sample vectors that are mapped to the hash bucket, and determining that the construction of the data filter is completed, where the data filter includes the k detection vectors, and the k hash buckets that respectively correspond to values of corresponding hash buckets.

With reference to the second aspect, in a first possible implementation manner of the second aspect, before the segmenting the sample vector to obtain k sample sub-vectors, the method further includes obtaining the k detection vectors from a particular distribution, and respectively performing a normalization operation on the k detection vectors such that L2 norms of the k detection vectors are 1, where the particular distribution meets that after a normalization operation is performed on any vector obtained from the particular distribution, an L2 norm of the any vector is 1.

With reference to the second aspect or the first possible implementation manner of the second aspect, in a second possible implementation manner of the second aspect, after the k sample sub-vectors are obtained, the method further includes respectively performing a normalization operation on the k sample sub-vectors, and the respectively performing a particular operation on the k sample sub-vectors and corresponding detection vectors among the preset k detection vectors to obtain k second operation results includes respectively performing the particular operation on the k sample sub-vectors after the normalization operation and the corresponding detection vectors among the k detection vectors to obtain the k second operation results.

According to a third aspect of the present disclosure, an apparatus for data filtering is provided, including a segmentation module configured to segment a to-be-detected vector to obtain k to-be-detected sub-vectors, an arithmetic module configured to respectively perform an inner product operation on the k to-be-detected sub-vectors and corresponding detection vectors among preset k detection vectors to obtain k first operation results, a determining module configured to determine a first operation result whose value is the maximum among the k first operation results and obtain an identifier of a detection vector corresponding to the first operation result, where a detection vector is in a one-to-one correspondence to an identifier, and a mapping module configured to map the to-be-detected vector to a preset data filter according to the obtained identifier of the detection vector corresponding to the first operation result whose value is the maximum, and determine, using the data filter, whether to filter out the to-be-detected vector.

With reference to the third aspect, in a first possible implementation manner of the third aspect, the apparatus further includes an operation module, configured to after the to-be-detected vector is segmented to obtain the k to-be-detected sub-vectors, respectively perform a normalization operation on the k to-be-detected sub-vectors, and the arithmetic module is configured to respectively perform the inner product operation on the k to-be-detected sub-vectors after the normalization operation and the corresponding detection vectors among the k detection vectors to obtain the k first operation results.

With reference to the third aspect or the first possible implementation manner of the third aspect, in a second possible implementation manner of the third aspect, the apparatus further includes a construction module configured to construct the data filter.

With reference to the second possible implementation manner of the third aspect, in a third possible implementation manner of the third aspect, the construction module is configured to take N sample vectors, and perform the following steps for each sample vector of the N sample vectors segmenting the sample vector to obtain k sample sub-vectors, respectively performing an inner product operation on the k sample sub-vectors and corresponding detection vectors among the preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, and an identifier of a detection vector is in a one-to-one correspondence to a hash bucket, after the mapping of the N sample vectors is completed, respectively obtain values of the k hash buckets to determine, according to a value of a corresponding hash bucket, whether to filter out the to-be-detected vector, where a value of each hash bucket is a total quantity of sample vectors that are mapped to the hash bucket, and determine that the construction of the data filter is completed, where the data filter includes the k detection vectors, and the k hash buckets that respectively correspond to values of corresponding hash buckets.

With reference to the third possible implementation manner of the third aspect, in a fourth possible implementation manner of the third aspect, the mapping module is configured to map the to-be-detected vector to a particular hash bucket, and determine whether a value of the particular hash bucket is greater than a preset threshold, where the particular hash bucket is a hash bucket that is in the data filter and that corresponds to the identifier of the detection vector corresponding to the first operation result whose value is the maximum, and if the value of the particular hash bucket is greater than the preset threshold, determine to filter out the to-be-detected vector.

With reference to the third possible implementation manner of the third aspect or the fourth possible implementation manner of the third aspect, in a fifth possible implementation manner of the third aspect, the apparatus further includes an obtaining module, configured to before the sample vector is segmented to obtain the k sample sub-vectors, obtain the k detection vectors from a particular distribution, and respectively perform a normalization operation on the k detection vectors such that L2 norms of the k detection vectors are 1, where the particular distribution meets that after a normalization operation is performed on any vector obtained from the particular distribution, an L2 norm of the any vector is 1.

With reference to the third possible implementation manner of the third aspect, the fourth possible implementation manner of the third aspect, or the fifth possible implementation manner of the third aspect, in a sixth possible implementation manner of the third aspect, the apparatus further includes the operation module, configured to after the k sample sub-vectors are obtained, respectively perform a normalization operation on the k sample sub-vectors, and the construction module being configured to respectively perform an inner product operation on the k sample sub-vectors and corresponding detection vectors among the preset k detection vectors to obtain k second operation results is respectively performing the inner product operation on the k sample sub-vectors after the normalization operation and the corresponding detection vectors among the k detection vectors to obtain the k second operation results.

According to a fourth aspect of the present disclosure, an apparatus for constructing a data filter is provided, including a performing module configured to take N sample vectors, and perform the following steps for each sample vector of the N sample vectors segmenting the sample vector to obtain k sample sub-vectors, respectively performing an inner product operation on the k sample sub-vectors and corresponding detection vectors among preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, a detection vector is in a one-to-one correspondence to an identifier, and an identifier of a detection vector is also in a one-to-one correspondence to a hash bucket, a first determining module, configured to after the mapping of the N sample vectors is completed, respectively obtain values of the k hash buckets to determine, according to a value of a corresponding hash bucket, whether to filter out the to-be-detected vector, where a value of each hash bucket is a total quantity of sample vectors that are mapped to the hash bucket, and a second determining module configured to determine that the construction of the data filter is completed, where the data filter includes the k detection vectors, and the k hash buckets that respectively correspond to values of corresponding hash buckets.

With reference to the fourth aspect, in a first possible implementation manner of the fourth aspect, the apparatus further includes an operation module configured to obtain the k detection vectors from a particular distribution, and respectively perform a normalization operation on the k detection vectors such that L2 norms of the k detection vectors are 1, where the particular distribution meets that after a normalization operation is performed on any vector obtained from the particular distribution, an L2 norm of the any vector is 1.

With reference to the fourth aspect or the first possible implementation manner of the fourth aspect, in a second possible implementation manner of the fourth aspect, the apparatus further includes the operation module configured to respectively perform a normalization operation on the k sample sub-vectors, and the performing module being configured to respectively perform a particular operation on the k sample sub-vectors and corresponding detection vectors among preset k detection vectors to obtain k second operation results is respectively performing the particular operation on the k sample sub-vectors after the normalization operation and the corresponding detection vectors among the k detection vectors to obtain the k second operation results.

According to a fifth aspect of the present disclosure, an apparatus for data filtering is provided, including a processor and a memory, where the memory is configured to store an instruction needed by the processor to execute a program, and the processor is configured to read the instruction stored in the memory to perform the following method segmenting a to-be-detected vector to obtain k to-be-detected sub-vectors, respectively performing an inner product operation on the k to-be-detected sub-vectors and corresponding detection vectors among preset k detection vectors to obtain k first operation results, determining a first operation result whose value is the maximum among the k first operation results and obtaining an identifier of a detection vector corresponding to the first operation result, where a detection vector is in a one-to-one correspondence to an identifier, and mapping the to-be-detected vector to a preset data filter according to the obtained identifier of the detection vector corresponding to the first operation result whose value is the maximum, and determining, using the data filter, whether to filter out the to-be-detected vector.

With reference to the fifth aspect, in a first possible implementation manner of the fifth aspect, the processor is further configured to read the instruction stored in the memory to perform the following method after the to-be-detected vector is segmented to obtain the k to-be-detected sub-vectors, respectively performing a normalization operation on the k to-be-detected sub-vectors, and the processor being configured to respectively perform an inner product operation on the k to-be-detected sub-vectors and corresponding detection vectors among preset k detection vectors to obtain k first operation results is respectively performing the inner product operation on the k to-be-detected sub-vectors after the normalization operation and the corresponding detection vectors among the k detection vectors to obtain the k first operation results.

With reference to the fifth aspect or the first possible implementation manner of the fifth aspect, in a second possible implementation manner of the fifth aspect, the processor is further configured to read the instruction stored in the memory to perform the following method before the to-be-detected vector is segmented to obtain the k to-be-detected sub-vectors, constructing the data filter.

With reference to the second possible implementation manner of the fifth aspect, in a third possible implementation manner of the fifth aspect, the processor being configured to construct the data filter is taking N sample vectors, and performing the following steps for each sample vector of the N sample vectors segmenting the sample vector to obtain k sample sub-vectors, respectively performing an inner product operation on the k sample sub-vectors and corresponding detection vectors among the preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, and an identifier of a detection vector is in a one-to-one correspondence to a hash bucket, after the mapping of the N sample vectors is completed, respectively obtaining values of the k hash buckets to determine, according to a value of a corresponding hash bucket, whether to filter out the to-be-detected vector, where a value of each hash bucket is a total quantity of sample vectors that are mapped to the hash bucket, and determining that the construction of the data filter is completed, where the data filter includes the k detection vectors, and the k hash buckets that respectively correspond to values of corresponding hash buckets.

With reference to the third possible implementation manner of the fifth aspect, in a fourth possible implementation manner of the fifth aspect, the processor being configured to map the to-be-detected vector to a preset data filter according to the obtained identifier of the detection vector corresponding to the first operation result whose value is the maximum, and determine, using the data filter, whether to filter out the to-be-detected vector is mapping the to-be-detected vector to a particular hash bucket, and determining whether a value of the particular hash bucket is greater than a preset threshold, where the particular hash bucket is a hash bucket that is in the data filter and that corresponds to the identifier of the detection vector corresponding to the first operation result whose value is the maximum, and if the value of the particular hash bucket is greater than the preset threshold, determining to filter out the to-be-detected vector.

With reference to the third possible implementation manner or the fourth possible implementation manner of the fifth aspect, in a fifth possible implementation manner of the fifth aspect, the processor is further configured to read the instruction stored in the memory to perform the following method before the sample vector is segmented to obtain the k sample sub-vectors, obtaining the k detection vectors from a particular distribution, and respectively performing a normalization operation on the k detection vectors such that L2 norms of the k detection vectors are 1, where the particular distribution meets that after a normalization operation is performed on any vector obtained from the particular distribution, an L2 norm of the any vector is 1.

With reference to the third possible implementation manner, the fourth possible implementation manner, or the fifth possible implementation manner of the fifth aspect, in a sixth possible implementation manner of the fifth aspect, the processor is further configured to read the instruction stored in the memory to perform the following method after the k sample sub-vectors are obtained, respectively performing a normalization operation on the k sample sub-vectors, and the processor being configured to respectively perform an inner product operation on the k sample sub-vectors and corresponding detection vectors among the preset k detection vectors to obtain k second operation results is respectively performing the inner product operation on the k sample sub-vectors after the normalization operation and the corresponding detection vectors among the k detection vectors to obtain the k second operation results.

According to a sixth aspect of the present disclosure, an apparatus for constructing a data filter is provided, including a processor and a memory, where the memory is configured to store an instruction needed by the processor to execute a program, and the processor is configured to read the instruction stored in the memory to perform the following method taking N sample vectors, and performing the following steps for each sample vector of the N sample vectors segmenting the sample vector to obtain k sample sub-vectors, respectively performing an inner product operation on the k sample sub-vectors and corresponding detection vectors among preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, each detection vector corresponds to one identifier, a detection vector is in a one-to-one correspondence to an identifier, and an identifier of a detection vector is also in a one-to-one correspondence to a hash bucket, after the mapping of the N sample vectors is completed, respectively obtain values of the k hash buckets to determine, according to a value of a corresponding hash bucket, whether to filter out the to-be-detected vector, where a value of each hash bucket is a total quantity of sample vectors that are mapped to the hash bucket, and determine that the construction of the data filter is completed, where the data filter includes the k detection vectors, and the k hash buckets that respectively correspond to values of corresponding hash buckets.

With reference to the sixth aspect, in a first possible implementation manner of the sixth aspect, the processor is further configured to read the instruction stored in the memory to perform the following method before the sample vector is segmented to obtain the k sample sub-vectors, obtaining the k detection vectors from a particular distribution, and respectively performing a normalization operation on the k detection vectors such that L2 norms of the k detection vectors are 1, where the particular distribution meets that after a normalization operation is performed on any vector obtained from the particular distribution, an L2 norm of the any vector is 1.

With reference to the sixth aspect or the first possible implementation manner of the sixth aspect, in a second possible implementation manner of the sixth aspect, the processor is further configured to read the instruction stored in the memory to perform the following method after the k sample sub-vectors are obtained, respectively performing a normalization operation on the k sample sub-vectors, and the processor being configured to respectively perform a particular operation on the k sample sub-vectors and corresponding detection vectors among the preset k detection vectors to obtain k second operation results includes respectively performing the particular operation on the k sample sub-vectors after the normalization operation and the corresponding detection vectors among the k detection vectors to obtain the k second operation results.

In the embodiments of the present disclosure, the to-be-detected vector is to-be-detected stream data, and detection is performed by segmenting the to-be-detected vector into multiple to-be-detected sub-vectors, which can ensure detection precision, and reduce calculation complexity. In addition, in the embodiments of the present disclosure, whether two vectors are similar is determined using an inner product, which is more accurate, compared with using string matching, and which can also process data with higher complexity. Compared with the prior art in which a model is constructed, a process in the embodiments of the present disclosure is simpler, and operation steps are reduced.

DESCRIPTION OF EMBODIMENTS

Figure 1:
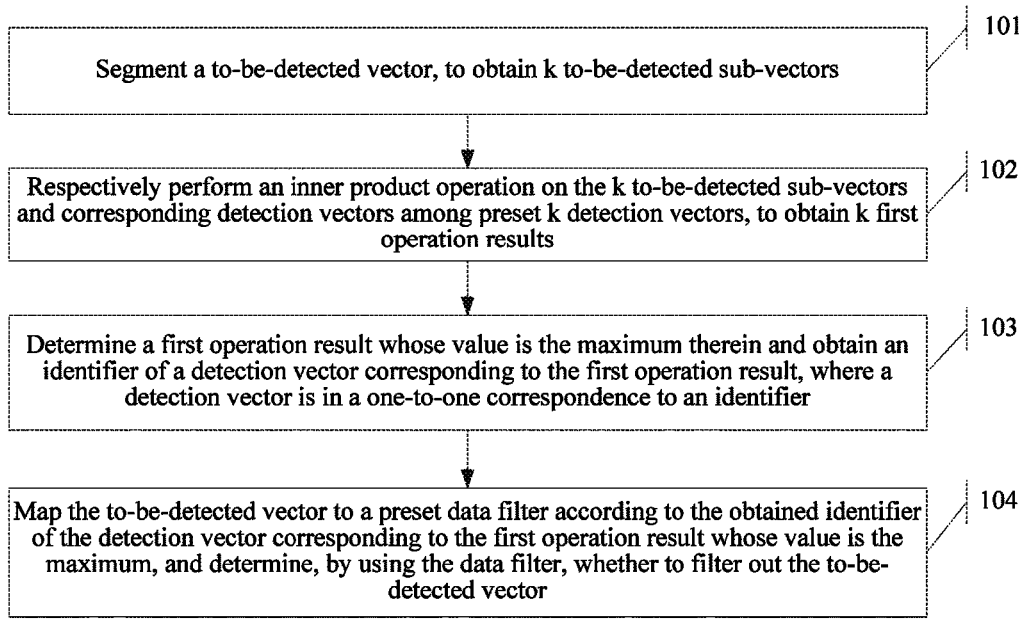
FIG. 1 is a main flowchart of a method for data filtering according to an embodiment of the present disclosure.

A method for data filtering in embodiments of the present disclosure may include segmenting a to-be-detected vector to obtain k to-be-detected sub-vectors, respectively performing an inner product operation on the k to-be-detected sub-vectors and corresponding detection vectors among preset k detection vectors to obtain k first operation results, determining a first operation result whose value is the maximum among the k first operation results and obtaining an identifier of a detection vector corresponding to the first operation result, where each detection vector corresponds to one identifier, and a detection vector is in a one-to-one correspondence to an identifier, and mapping the to-be-detected vector to a preset data filter according to the obtained identifier of the detection vector corresponding to the first operation result whose value is the maximum, and determining, using the data filter, whether to filter out the to-be-detected vector.

In the embodiments of the present disclosure, the to-be-detected vector is to-be-detected stream data, and detection is performed by segmenting the to-be-detected vector into multiple to-be-detected sub-vectors, which can ensure detection precision, and reduce calculation complexity. In addition, in the embodiments of the present disclosure, whether two vectors are similar is determined using an inner product, which is more accurate, compared with using string matching, and which can also process data with higher complexity.

To make the objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

Technologies described in this specification may be applied to various communications systems, for example, current 2G and 3G communications systems and a next-generation communications system, for example, a Global System for Mobile Communications (GSM) system, a Code Division Multiple Access (CDMA) system, a Time Division Multiple Access (TDMA) system, a Wideband Code Division Multiple Access (WCDMA) system, a Frequency Division Multiple Access (FDMA) system, an Orthogonal Frequency Division Multiple Access (OFDMA) system, a single-carrier FDMA (SC-FDMA) system, a General Packet Radio Service (GPRS) system, a Long Term Evolution (LTE) system, and other communications systems.

In addition, the terms "system" and "network" may be used interchangeably in this specification. The term "and/or" in this specification describes only an association relationship for describing associated objects and represents that three relationships may exist. For example, A and/or B may represent the following three cases: only A exists, both A and B exist, and only B exists. In addition, the character "/" in this specification generally indicates an "or" relationship between the associated objects, unless otherwise specified.

The following further describes the embodiments of the present disclosure in detail with reference to the accompanying drawings in this specification.

Referring to FIG. 1, an embodiment of the present disclosure provides a method for data filtering. A main procedure of the method is described by the following steps:

Step 101: Segment a to-be-detected vector to obtain k to-be-detected sub-vectors.

In an embodiment, before data filtering is performed, a data filter needs to be constructed first. That is, before step 101, the method further includes constructing the data filter.

In an embodiment, the constructing the data filter includes taking N sample vectors, and performing the following steps for each sample vector of the N sample vectors segmenting the sample vector to obtain k sample sub-vectors, respectively performing an inner product operation on the k sample sub-vectors and corresponding detection vectors among preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, and an identifier of a detection vector is in a one-to-one correspondence to a hash bucket, after the mapping of the N sample vectors is completed, respectively obtaining values of the k hash buckets to determine, according to a value of a corresponding hash bucket, whether to filter out the to-be-detected vector, where a value of each hash bucket is a total quantity of sample vectors that are mapped to the hash bucket, and determining that the construction of the data filter is completed, where the data filter includes the k detection vectors, and the k hash buckets that respectively correspond to values of corresponding hash buckets.

When the data filter is constructed, multiple sample vectors need to be used, for example, a total of the N sample vectors are used. Theoretically, a larger N indicates a better filtration effect of a constructed data filter. However, in consideration of a factor such as an arithmetic quantity, a value of N may be determined according to an actual situation.

In an embodiment, the k detection vectors may be obtained from a particular distribution. Each detection vector thereof corresponds to one identifier, and a detection vector is in a one-to-one correspondence to an identifier. As long as an identifier is known, a detection vector corresponding to the identifier can be known.

In an embodiment, before the segmenting the sample vector to obtain k sample sub-vectors, the method may further include obtaining the k detection vectors from the particular distribution, and respectively performing a normalization operation on the k detection vectors such that L2 norms of the k detection vectors are 1, where the particular distribution meets that after a normalization operation is performed on any vector obtained from the particular distribution, an L2 norm of the any vector is 1.

That is, the particular distribution needs to meet at least one condition after a normalization operation is performed on any vector obtained from the particular distribution, an L2 norm of the any vector is 1. That is, when random projection is performed on the particular distribution, the particular distribution has some features, and one feature thereof is that an L2 norm of a vector obtained from the particular distribution can be maintained. Therefore, a hash function needs to be used when the data filter is constructed, and a locality-sensitive property (locality-sensitive property) of the hash function can be ensured only when the particular distribution has these features. For example, the particular distribution may be a standard normal distribution, or may be another distribution that has these features. In an embodiment, the standard normal distribution refers to a Gaussian distribution whose average value is 0 and whose variance is 1.

In an embodiment, after the k sample sub-vectors are obtained, the method may further include respectively performing a normalization operation on the k sample sub-vectors. Therefore, the respectively performing an inner product operation on the k sample sub-vectors and corresponding detection vectors among the preset k detection vectors to obtain k second operation results may include respectively performing the inner product operation on the k sample sub-vectors after the normalization operation and the corresponding detection vectors among the k detection vectors to obtain the k second operation results.

For example, for an $i^{th}$ sample vector in the N sample vectors, the sample vector may be segmented, and a segmentation manner is as follows it is assumed that the $i^{th}$ sample vector may be expressed using a vector y in d-dimension real number space, that is, y is the $i^{th}$ sample vector. An integer parameter k is given. First, random shuffle is performed on d coordinates of the vector y, and then the vector y after the shuffle is evenly segmented into k groups to obtain k sample sub-vectors $y_1, y_2, \ldots,$ and $y_k$. When d cannot be exactly divided by k, a length of $y_k$ is less than d/k, otherwise, a length of each sample sub-vector is d/k.

In an embodiment, after the k detection vectors are obtained, a normalization operation may also be performed on the k detection vectors such that each of values of L2 norms of the k detection vectors is 1.

The following uses $y_k$ as an example. It is assumed that $y_k(i)$ indicates an $i^{th}$ element in $y_k$. A process of performing a normalization operation on $y_k$ is as follows $$s_2 = \sqrt{\sum_{i=1}^{d/k} y_k^2(i)} \quad (1)$$

$$y_k(i) = \frac{y_k(i)}{s_2} \quad (2)$$

where $s_2$ is an L2 norm of $y_k$, and $y_k(i)$ indicates a normalized $y_k$.

After a normalization operation is performed on all the k sample sub-vectors, an inner product operation may be respectively performed on the k sample sub-vectors after the normalization operation and corresponding detection vectors among the k detection vectors. In an embodiment, the inner product operation is performed on a sample sub-vector and a detection vector corresponding to the sample sub-vector, where a meaning of "corresponding" refers to that corresponding identifiers are the same. In the k detection vectors, each detection vector corresponds to an identifier, and then, for each sample vector, after each sample vector is segmented into the k sample sub-vectors, one identifier may be set for each sample sub-vector. In general, a total of k identifiers may be set for the k sample sub-vectors, and the k detection vectors also correspond to a total of k identifiers. Therefore, the k identifiers set for the k sample sub-vectors are respectively the same as the k identifiers corresponding to the k detection vectors. For example, there are a total of three detection vectors, and identifiers corresponding to the three detection vectors are respectively 1, 2, and 3. One sample vector is segmented into a total of three sample sub-vectors, and the identifiers 1, 2, and 3 are also respectively set for the three sample sub-vectors.

Therefore, a specific manner in which the inner product operation is respectively performed on the k sample sub-vectors and the corresponding detection vectors among the k detection vectors is that the inner product operation is performed on a sample sub-vector whose identifier is 1 and a detection vector whose identifier is also 1, the inner product operation is performed on a sample sub-vector whose identifier is 2 and a detection vector whose identifier is also 2, ..., and the inner product operation is performed on a sample sub-vector whose identifier is k and a detection vector whose identifier is also k such that a total of the k second operation results can be obtained.

The inner product operation is performed on the sample sub-vector whose identifier is 1 and the detection vector whose identifier is also 1, where, for example, an identifier of the second operation result is the identifier 1, the inner product operation is performed on the sample sub-vector whose identifier is 2 and the detection vector whose identifier is also 2, where, for example, an identifier of the second operation result is the identifier 2, . . . , and the inner product operation is performed on the sample sub-vector whose identifier is k and the detection vector whose identifier is also k, where, for example, an identifier of the second operation result is the identifier k. It can be seen that, an identifier of each second operation result is actually an identifier of a detection vector corresponding to the second operation result.

For example, if the second operation result whose value is the maximum in the k second operation results is determined, the identifier of the detection vector corresponding to the second operation result whose value is the maximum is obtained. For example, for a sample vector, it is determined that the identifier of the detection vector corresponding to the second operation result whose value is the maximum is the identifier 3. A corresponding hash bucket is preset for each detection vector, an identifier of a detection vector is in a one-to-one correspondence to a hash bucket, and as long as an identifier of a detection vector is determined, a corresponding hash bucket can be determined. Therefore, the sample vector may be mapped to a hash bucket corresponding to the identifier 3.

Same processing is performed on each sample vector of the N sample vectors, and then each sample vector may be mapped to one hash bucket. After mapping of all sample vectors is completed, a quantity of sample vectors mapped to each hash bucket may be counted. A total quantity of sample vectors mapped to one hash bucket is set to a value of the hash bucket. For example, if a total of six sample vectors are mapped to the hash bucket whose identifier is the identifier 3, a value of the hash bucket of the identifier 3 is 6.

After the value of each hash bucket is obtained, construction of the data filter is equivalently completed. The data filter includes the k detection vectors and the k hash buckets, where each hash bucket has a corresponding value. Therefore, a to-be-detected vector may be mapped to a corresponding hash bucket according to the k detection vectors to determine which processing should be performed on the corresponding to-be-detected vector.

In an embodiment, the to-be-detected vector is to-be-detected stream data.

When the to-be-detected vector is segmented, a segmentation manner may be the same as a manner in which the sample vector is segmented, that is, it is assumed that the to-be-detected vector may be expressed using a vector x in the d-dimension real number space, that is, x is the to-be-detected vector. An integer parameter k is given. First, random shuffle (random shuffle) is performed on d coordinates of the vector x, and then the vector x after the shuffle is evenly segmented into k groups to obtain k to-be-detected sub-vectors $x_1, x_2, \ldots,$ and $x_k$. When d cannot be exactly divided by k, a length of $x_k$ is less than d/k, otherwise, a length of each to-be-detected sub-vector is d/k.

In an embodiment, after the segmenting a to-be-detected vector to obtain k to-be-detected sub-vectors, the method further includes respectively performing a normalization operation on the k to-be-detected sub-vectors. A method for performing the normalization operation on the to-be-detected sub-vectors may be the same as the method for performing the normalization operation on the sample sub-vectors.

The following uses $x_k$ as an example. It is assumed that $x_k(i)$ indicates an $i^{th}$ element in $x_k$. A process of performing a normalization operation on $x_k$ is as follows $$s_1 = \sqrt{\sum_{i=1}^{d/k} x_k^2(i)} \quad (3)$$

$$x_k(i) = \frac{x_k(i)}{s_1} \quad (4)$$

where $s_1$ is an L2 norm of $x_k$, and $x_k(i)$ indicates a normalized $x_k$.

In an embodiment, the to-be-detected vector may be segmented into k different to-be-detected sub-vectors, and each to-be-detected sub-vector is also normalized.

In an embodiment, a normalization operation may be performed on all of the to-be-detected vector, the sample vector, and the detection vector such that obtained results can be more accurate.

Step 102: Respectively perform an inner product operation on the k to-be-detected sub-vectors and corresponding detection vectors among preset k detection vectors to obtain k first operation results.

In an embodiment, after the k to-be-detected sub-vectors are obtained, the inner product operation may be respectively performed on the k to-be-detected sub-vectors and the corresponding detection vectors among the k detection vectors. Similarly, the inner product operation is performed on a to-be-detected sub-vector and a detection vector corresponding to the to-be-detected sub-vector, where a meaning of "corresponding" refers to that corresponding identifiers are the same. In the k detection vectors, each detection vector corresponds to an identifier, and then, for each to-be-detected vector, after each to-be-detected vector is segmented into the k to-be-detected sub-vectors, one identifier may be set for each to-be-detected sub-vector. In general, a total of k identifiers may be set for the k to-be-detected sub-vectors, and the k detection vectors also correspond to a total of k identifiers. Therefore, the k identifiers set for the k to-be-detected sub-vectors are respectively the same as the k identifiers corresponding to the k detection vectors. For example, there are a total of three detection vectors, and identifiers corresponding to the three detection vectors are respectively 1, 2, and 3. One to-be-detected vector is segmented into a total of three sample sub-vectors, and the identifiers 1, 2, and 3 are also respectively set for the three sample sub-vectors.

Therefore, a specific manner in which the inner product operation is respectively performed on the k to-be-detected sub-vectors and the corresponding detection vectors among the k detection vectors is that the inner product operation is performed on a to-be-detected sub-vector whose identifier is 1 and the detection vector whose identifier is also 1, the inner product operation is performed on a to-be-detected sub-vector whose identifier is 2 and the detection vector whose identifier is also 2, . . . , and the inner product operation is performed on a to-be-detected sub-vector whose identifier is k and the detection vector whose identifier is also k such that a total of the k first operation results can be obtained.

In an embodiment, if a normalization operation is respectively performed on the k to-be-detected sub-vectors after the k to-be-detected sub-vectors are obtained, the step may be respectively performing the inner product operation on the k to-be-detected sub-vectors after the normalization operation and the corresponding detection vectors among the k detection vectors to obtain the k first operation results.

Step 103: Determine a first operation result whose value is the maximum among the k first operation results and obtain an identifier of a detection vector corresponding to the first operation result, where a detection vector is in a one-to-one correspondence to an identifier.

For example, the inner product operation is performed on the to-be-detected sub-vector whose identifier is 1 and the detection vector whose identifier is also 1, where, for example, an identifier of the first operation result is the identifier 1, the inner product operation is performed on the to-be-detected sub-vector whose identifier is 2 and the detection vector whose identifier is also 2, where, for example, an identifier of the first operation result is the identifier 2, . . . , and the inner product operation is performed on the to-be-detected sub-vector whose identifier is k and the detection vector whose identifier is also k, where, for example, an identifier of the first operation result is the identifier k. It can be seen that, an identifier of each first operation result is actually an identifier of a detection vector corresponding to the first operation result.

After the k first operation results are obtained, the first operation result whose value is the maximum in the k first operation results is determined, and then the identifier of the detection vector corresponding to the first operation result whose value is the maximum is obtained. For example, for a to-be-detected vector, the identifier of the detection vector corresponding to the determined first operation result whose value is the maximum is the identifier 2.

Step 104: Map the to-be-detected vector to a preset data filter according to the obtained identifier of the detection vector corresponding to the first operation result whose value is the maximum, and determine, using the data filter, whether to filter out the to-be-detected vector.

Before step 101, the construction of the data filter may be completed. Therefore, the to-be-detected vector may be directly mapped to the data filter, and it may be determined, using the data filter, whether to filter out the to-be-detected vector.

In an embodiment, the mapping the to-be-detected vector to a preset data filter according to the obtained identifier of the detection vector corresponding to the first operation result whose value is the maximum, and determining, using the data filter, whether to filter out the to-be-detected vector includes mapping the to-be-detected vector to a particular hash bucket, and determining whether a value of the particular hash bucket is greater than a preset threshold, where the particular hash bucket is a hash bucket that is in the data filter and that corresponds to the identifier of the detection vector corresponding to the first operation result whose value is the maximum, and if the value of the particular hash bucket is greater than the preset threshold, determining to filter out the to-be-detected vector.

For example, if the identifier of the detection vector corresponding to the determined first operation result whose value is the maximum is the identifier 2, the to-be-detected vector may be mapped to the data filter and a hash bucket corresponding to the identifier 2. In this case, the hash bucket corresponding to the identifier 2 may be referred to as the particular hash bucket. If the identifier of the detection vector corresponding to the determined first operation result whose value is the maximum is an identifier 4, the to-be-detected vector may be mapped to the data filter and a hash bucket corresponding to the identifier 4. In this case, the hash bucket corresponding to the identifier 4 may be referred to as the particular hash bucket. That is, the particular hash bucket is not a fixed hash bucket, and the particular hash bucket correspondingly varies with the identifier corresponding to the determined first operation result whose value is the maximum.

In an embodiment, regardless of whether the sample vector is mapped or the to-be-detected vector is mapped, the k detection vectors are relied on. Identifiers of the k to-be-detected sub-vectors, identifiers of the k sample sub-vectors, and identifiers of the hash buckets are all determined according to identifiers of the k detection vectors. Therefore, if one to-be-detected vector and one sample vector are both mapped to a same hash bucket, it indicates that when an operation is performed on the two vectors and the k detection vectors, detection vectors corresponding to operation results whose values are the maximum and that are obtained through the operation are a same detection vector, which indicates that the two vectors are similar.

After the to-be-detected vector is mapped to a hash bucket, a value of the hash bucket may be determined. After the value of the hash bucket is determined, whether the value of the hash bucket is greater than the preset threshold may be determined.

If the value of the hash bucket is greater than the preset threshold, it is determined that the to-be-detected vector is similar to multiple sample vectors, and it is determined that the to-be-detected vector should be filtered out.

It can be seen that a larger value of a hash bucket to which the to-be-detected vector is mapped indicates a greater possibility of filtering out the to-be-detected vector. A larger value of a hash bucket to which the to-be-detected vector is mapped indicates a larger quantity of sample vectors mapped to the hash bucket, and also indicates that the to-be-detected vector is similar to multiple sample vectors in a sample set. Therefore, it may be determined that the to-be-detected vector is a vector that should be filtered out.

The preset threshold may be set according to different situations. In an embodiment, a quantity of vectors to be filtered out may be controlled by setting the preset threshold, and a strictness degree of data filtering may also be controlled.

In an embodiment, when a specific operation is performed, multiple data filters may be set in a cascading manner. Each data filter may be constructed using different detection vectors and different sample vectors. In this way, multi-level filtration is performed on the to-be-detected vector, which further improves a filtration effect, and improves data security.

Figure 2:
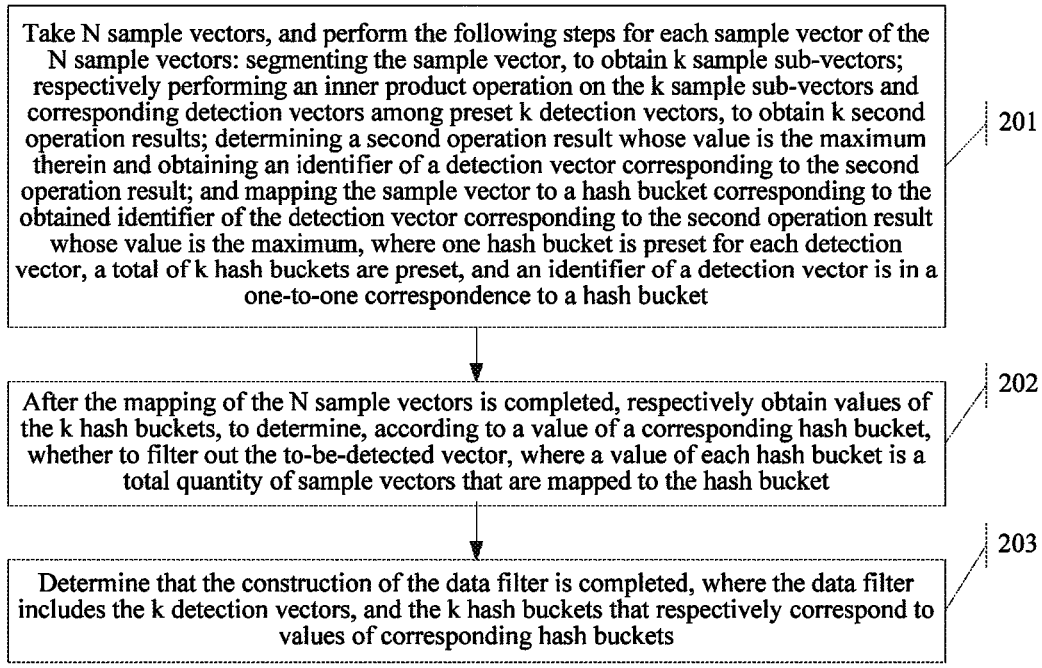
FIG. 2 is a main flowchart of a method for constructing a data filter according to an embodiment of the present disclosure.

Referring to FIG. 2, an embodiment of the present disclosure provides a method for constructing a data filter. A main procedure of the method is includes the following steps:

Step 201: Take N sample vectors, and perform the following steps for each sample vector of the N sample vectors segmenting the sample vector to obtain k sample sub-vectors, respectively performing an inner product operation on the k sample sub-vectors and corresponding detection vectors among preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, a detection vector is in a one-to-one correspondence to an identifier, and an identifier of a detection vector is also in a one-to-one correspondence to a hash bucket.

In an embodiment, before step 201, that is, before the segmenting the sample vector to obtain k sample sub-vectors, the method further includes obtaining the k detection vectors from a particular distribution, and respectively performing a normalization operation on the k detection vectors such that L2 norms of the k detection vectors are 1, where the particular distribution meets that after a normalization operation is performed on any vector obtained from the particular distribution, an L2 norm of the any vector is 1.

In an embodiment, after the k sample sub-vectors are obtained, the method may further include respectively performing a normalization operation on the k sample sub-vectors, and then the respectively performing a particular operation on the k sample sub-vectors and corresponding detection vectors among the preset k detection vectors to obtain k second operation results may include respectively performing the particular operation on the k sample sub-vectors after the normalization operation and the corresponding detection vectors among the k detection vectors to obtain the k second operation results.

Step 202: After the mapping of the N sample vectors is completed, respectively obtain values of the k hash buckets to determine, according to a value of a corresponding hash bucket, whether to filter out the to-be-detected vector, where a value of each hash bucket is a total quantity of sample vectors that are mapped to the hash bucket.

Step 203: Determine that the construction of the data filter is completed, where the data filter includes the k detection vectors, and the k hash buckets that respectively correspond to values of corresponding hash buckets.

The method for constructing a data filter is described in detail the embodiment in FIG. 1, and details are not described herein again.

The following explains, using a specific example, the method for data filtering and the method for constructing a data filter that are described in the embodiments of the present disclosure.

For example, a total of two detection vectors, which are respectively referred to as a detection vector 1 and a detection vector 2, are obtained from the particular distribution, that is, k=2. An identifier corresponding to the detection vector 1 is an identifier 1 and an identifier corresponding to the detection vector 2 is an identifier 2. One hash bucket is respectively preset for the two detection vectors. For example, a hash bucket preset for the detection vector 1 is referred to as a hash bucket 1, and a hash bucket preset for the detection vector 2 is referred to as a hash bucket 2. An identifier, which is also the identifier 1, is preset for the hash bucket 1 according to the identifier of the detection vector 1, and an identifier, which is also the identifier 2, is preset for the hash bucket 2 according to the identifier of the detection vector 2. That is, an identifier of a hash bucket is the same as an identifier of a corresponding detection vector.

For example, a total of two sample vectors, which are respectively a sample vector 1 and a sample vector 2, are taken. For the sample vector 1, when the sample vector 1 is segmented, there are a total of two detection vectors, and therefore the sample vector 1 is segmented into two sample sub-vectors, which are respectively referred to as a sample sub-vector 1 and a sample sub-vector 2. An identifier, which is also the identifier 1, is preset for the sample sub-vector 1 according to the identifier of the detection vector 1, and an identifier, which is also the identifier 2, is preset for the sample sub-vector 2 according to the identifier of the detection vector 2. That is, an identifier of a sample sub-vector is the same as an identifier of a corresponding detection vector.

Subsequently, the inner product operation is performed on the sample sub-vector 1 and the detection vector 1 to obtain a second operation result 1, the inner product operation is performed on the sample sub-vector 2 and the detection vector 2 to obtain a second operation result 2, and a greater one of values of the second operation result 1 and the second operation result 2 is determined. For example, if it is determined that the value of the second operation result 1 is greater than the value of the second operation result 2, a detection vector corresponding to the second operation result 1 is further determined, it is determined that the detection vector corresponding to the second operation result 1 is the detection vector 1, and then it is determined that the identifier corresponding to the detection vector 1 is the identifier 1. Therefore, the sample vector 1 may be mapped to the hash bucket corresponding to the identifier 1.

Processing that is the same as that on the sample vector 1 is performed on the sample vector 2. For a processing process, details are not described again. For example, after the processing is completed, the sample vector 2 is also mapped to the hash bucket corresponding to the identifier 1. Therefore, it can be determined that a value of the hash bucket 1 is 2, and a value of the hash bucket 2 is 0.

In this way, the construction of the data filter is completed. The data filter includes two hash buckets, which are respectively the hash bucket 1 and the hash bucket 2, where the identifier of the hash bucket 1 is the identifier 1, the value of the hash bucket 1 is 2, the identifier of the hash bucket 2 is the identifier 2, and the value of the hash bucket 2 is 0. In addition, the data filter further includes two detection vectors, that is, the detection vector 1 whose identifier is the identifier 1, and the detection vector 2 whose identifier is the identifier 2.

In this case, whether a to-be-detected vector needs to be filtered out needs to be determined, for example, the to-be-detected vector is referred to as a to-be-detected vector 1. For the to-be-detected vector 1, when the to-be-detected vector 1 is segmented, there are a total of two detection vectors, and therefore the to-be-detected vector 1 is segmented into two to-be-detected sub-vectors, which are respectively referred to as a to-be-detected sub-vector 1 and a to-be-detected sub-vector 2. An identifier, which is also the identifier 1, is preset for the to-be-detected sub-vector 1 according to the identifier of the detection vector 1, and an identifier, which is also the identifier 2, is preset for the to-be-detected sub-vector 2 according to the identifier of the detection vector 2. That is, an identifier of a to-be-detected sub-vector is also the same as an identifier of a corresponding detection vector.

Therefore, for a sample sub-vector, a to-be-detected sub-vector, or a hash bucket, an identifier thereof is determined according to an identifier of the detection vector. Therefore, it may be said that an interrelationship among the sample vector, the to-be-detected vector, and the hash bucket is maintained by relying on the detection vector such that a sample vector and a to-be-detected vector that are similar can be mapped to a same hash bucket.

Subsequently, the inner product operation is performed on the to-be-detected sub-vector 1 and the detection vector 1 to obtain a first operation result 1, the inner product operation is performed on the to-be-detected sub-vector 2 and the detection vector 2 to obtain a first operation result 2, and a greater one of values of the first operation result 1 and the first operation result 2 is determined. For example, if it is determined that the value of the first operation result 1 is greater than the value of the first operation result 2, a detection vector corresponding to the first operation result 1 is further determined, it is determined that the detection vector corresponding to the first operation result 1 is the detection vector 1, and then it is determined that the identifier corresponding to the detection vector 1 is the identifier 1. Therefore, the to-be-detected vector 1 may be mapped to the hash bucket corresponding to the identifier 1. The to-be-detected vector 1 is mapped to the hash bucket 1, therefore, it may indicate that the to-be-detected vector 1 is similar to both the sample vector 1 and the sample vector 2.

Subsequently, whether the value of the hash bucket 1 is greater than the preset threshold is determined. For example, the preset threshold is 1, and it is determined that the value of the hash bucket 1 is 2. Therefore, it may be obviously determined that the value of the hash bucket 1 is greater than the preset threshold, and then it may be determined that the to-be-detected vector needs to be filtered out. That is, it is determined that the to-be-detected vector is similar to excessive sample vectors, and the to-be-detected vector needs to be filtered out.

Figure 3:
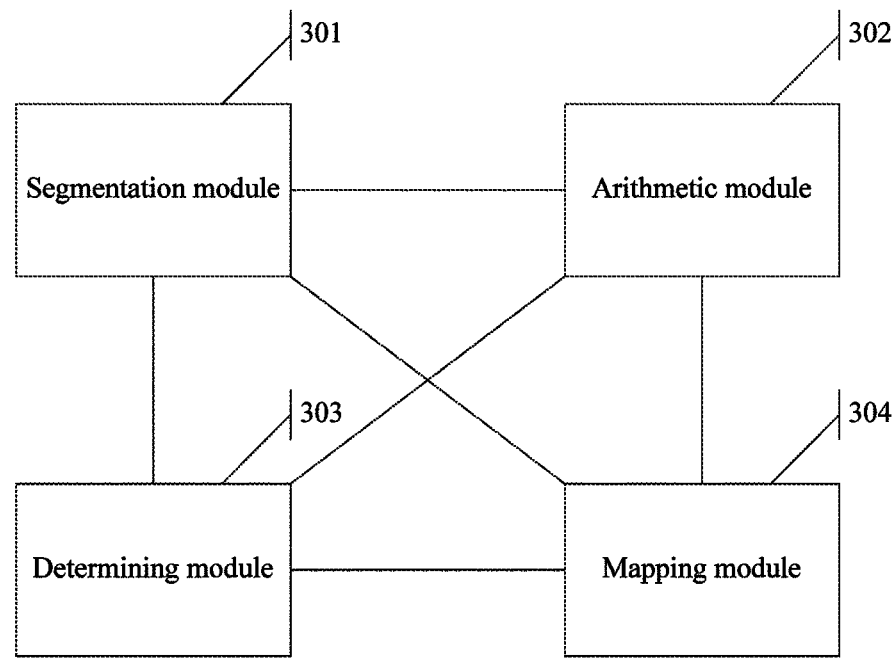
FIG. 3 is a main structural block diagram of an apparatus for data filtering according to an embodiment of the present disclosure.

Referring to FIG. 3, an embodiment of the present disclosure provides an apparatus for data filtering. The apparatus may include a segmentation module 301, an arithmetic module 302, a determining module 303, and a mapping module 304.

The segmentation module 301 is configured to segment a to-be-detected vector to obtain k to-be-detected sub-vectors.

The arithmetic module 302 is configured to respectively perform an inner product operation on the k to-be-detected sub-vectors and corresponding detection vectors among preset k detection vectors to obtain k first operation results.

The determining module 303 is configured to determine a first operation result whose value is the maximum among the k first operation results and obtain an identifier of a detection vector corresponding to the first operation result, where a detection vector is in a one-to-one correspondence to an identifier.

The mapping module 304 is configured to map the to-be-detected vector to a preset data filter according to the obtained identifier of the detection vector corresponding to the first operation result whose value is the maximum, and determine, using the data filter, whether to filter out the to-be-detected vector.

In an embodiment, the apparatus may further include an operation module, configured to after the to-be-detected vector is segmented to obtain the k to-be-detected sub-vectors, respectively perform a normalization operation on the k to-be-detected sub-vectors, and the arithmetic module 302 may be configured to respectively perform the inner product operation on the k to-be-detected sub-vectors after the normalization operation and the corresponding detection vectors among the k detection vectors to obtain the k first operation results.

In an embodiment, the apparatus may further include a construction module configured to construct the data filter.

In an embodiment, the construction module is configured to take N sample vectors, and perform the following steps for each sample vector of the N sample vectors segmenting the sample vector to obtain k sample sub-vectors, respectively performing an inner product operation on the k sample sub-vectors and corresponding detection vectors among the preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, and an identifier of a detection vector is in a one-to-one correspondence to a hash bucket, after the mapping of the N sample vectors is completed, respectively obtain values of the k hash buckets to determine, according to a value of a corresponding hash bucket, whether to filter out the to-be-detected vector, where a value of each hash bucket is a total quantity of sample vectors that are mapped to the hash bucket, and determine that the construction of the data filter is completed, where the data filter includes the k detection vectors, and the k hash buckets that respectively correspond to values of corresponding hash buckets.

In an embodiment, the mapping module 304 is configured to map the to-be-detected vector to a particular hash bucket, and determine whether a value of the particular hash bucket is greater than a preset threshold, where the particular hash bucket is a hash bucket that is in the data filter and that corresponds to the identifier of the detection vector corresponding to the first operation result whose value is the maximum, and if the value of the particular hash bucket is greater than the preset threshold, determine to filter out the to-be-detected vector.

In an embodiment, the apparatus may further include an obtaining module, configured to before the sample vector is segmented to obtain the k sample sub-vectors, obtain the k detection vectors from a particular distribution, and respectively perform a normalization operation on the k detection vectors such that L2 norms of the k detection vectors are 1, where the particular distribution meets that after a normalization operation is performed on any vector obtained from the particular distribution, an L2 norm of the any vector is 1.

In an embodiment, the operation module may be further configured to after the k sample sub-vectors are obtained, respectively perform a normalization operation on the k sample sub-vectors, and the construction module being configured to respectively perform an inner product operation on the k sample sub-vectors and corresponding detection vectors among the preset k detection vectors to obtain k second operation results is respectively performing the inner product operation on the k sample sub-vectors after the normalization operation and the corresponding detection vectors among the k detection vectors to obtain the k second operation results.

Figure 4:
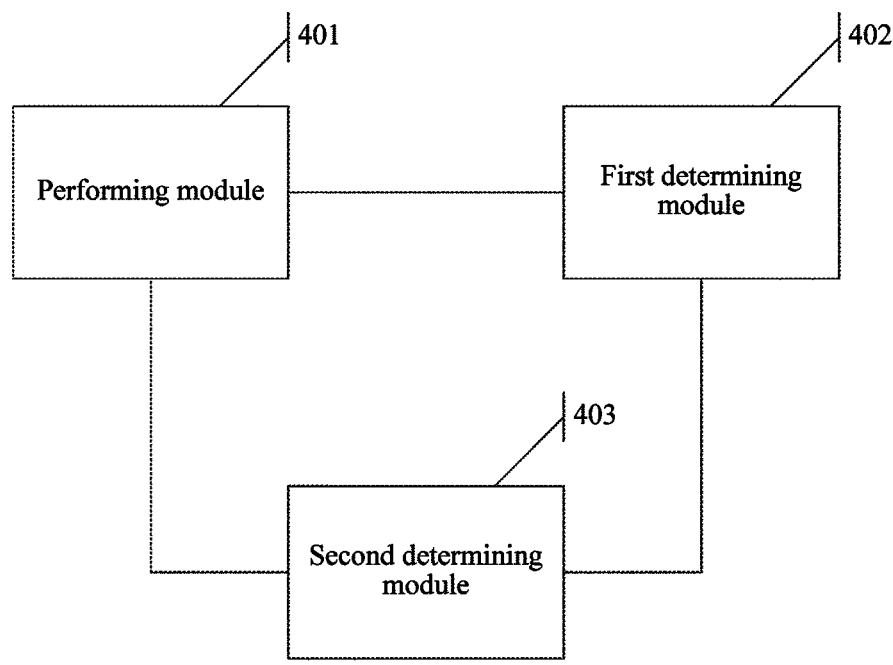
FIG. 4 is a main structural block diagram of an apparatus for constructing a data filter according to an embodiment of the present disclosure.

Referring to FIG. 4, an embodiment of the present disclosure provides an apparatus for constructing a data filter. The apparatus may include a performing module 401, a first determining module 402, and a second determining module 403. The apparatus for constructing a data filter and the foregoing apparatus for data filtering may be a same apparatus, or may be different apparatuses. If the apparatus for constructing a data filter and the apparatus for data filtering may be a same apparatus, the apparatus for constructing a data filter may be a module in the apparatus for data filtering, and may be the construction module in the apparatus for data filtering.

The performing module 401 is configured to take N sample vectors, and perform the following steps for each sample vector of the N sample vectors segmenting the sample vector to obtain k sample sub-vectors, respectively performing an inner product operation on the k sample sub-vectors and corresponding detection vectors among preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, a detection vector is in a one-to-one correspondence to an identifier, and an identifier of a detection vector is also in a one-to-one correspondence to a hash bucket.

The first determining module 402 is configured to after the mapping of the N sample vectors is completed, respectively obtain values of the k hash buckets to determine, according to a value of a corresponding hash bucket, whether to filter out the to-be-detected vector, where a value of each hash bucket is a total quantity of sample vectors that are mapped to the hash bucket.

The second determining module 403 is configured to determine that the construction of the data filter is completed, where the data filter includes the k detection vectors, and the k hash buckets that respectively correspond to values of corresponding hash buckets.

In an embodiment, the apparatus may further include an operation module configured to obtain the k detection vectors from a particular distribution, and respectively perform a normalization operation on the k detection vectors such that L2 norms of the k detection vectors are 1, where the particular distribution meets that after a normalization operation is performed on any vector obtained from the particular distribution, an L2 norm of the any vector is 1. The operation module in the embodiment in FIG. 4 and the operation module in the embodiment in FIG. 3 are not a same module.

In an embodiment, the operation module is further configured to respectively perform a normalization operation on the k sample sub-vectors, and the performing module 401 being configured to respectively perform a particular operation on the k sample sub-vectors and corresponding detection vectors among preset k detection vectors to obtain k second operation results is respectively performing the particular operation on the k sample sub-vectors after the normalization operation and the corresponding detection vectors among the k detection vectors to obtain the k second operation results.

Figure 5:
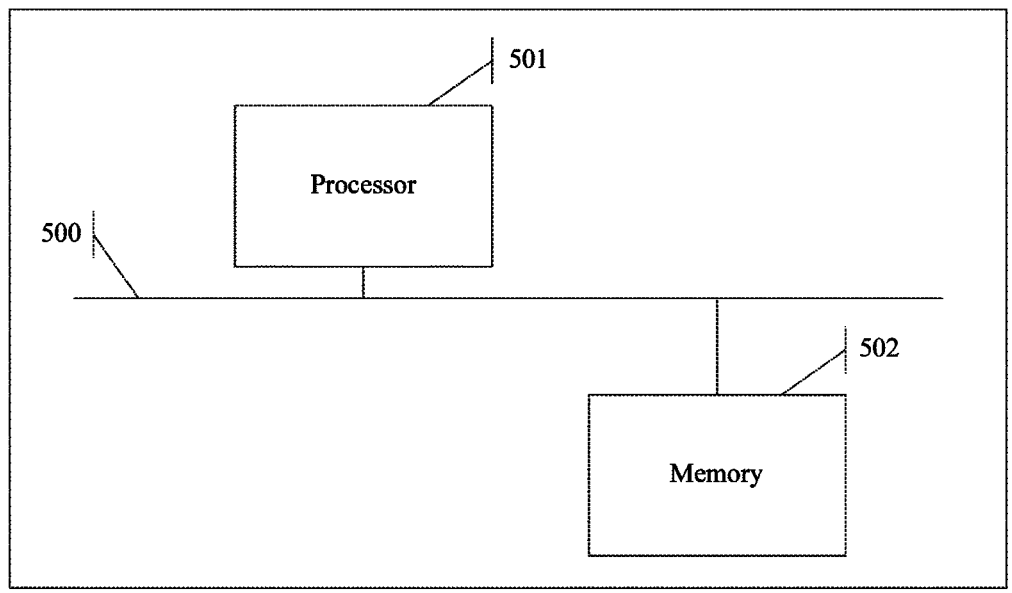
FIG. 5 is a main schematic structural diagram of an apparatus for data filtering according to an embodiment of the present disclosure.

Referring to FIG. 5, an embodiment of the present disclosure provides an apparatus for data filtering. The apparatus may include a processor 501 and memory 502 that are connected to a same bus 500. The memory 502 is configured to store an instruction needed by the processor 501 to execute a program, and the processor 501 is configured to read the instruction stored in the memory 502 to perform the following method segmenting a to-be-detected vector to obtain k to-be-detected sub-vectors, respectively performing an inner product operation on the k to-be-detected sub-vectors and corresponding detection vectors among preset k detection vectors to obtain k first operation results, determining a first operation result whose value is the maximum among the k first operation results and obtaining an identifier of a detection vector corresponding to the first operation result, where a detection vector is in a one-to-one correspondence to an identifier, and mapping the to-be-detected vector to a preset data filter according to the obtained identifier of the detection vector corresponding to the first operation result whose value is the maximum, and determining, using the data filter, whether to filter out the to-be-detected vector.

In an embodiment, the processor 501 is further configured to read the instruction stored in the memory 502 to perform the following method after the to-be-detected vector is segmented to obtain the k to-be-detected sub-vectors, respectively performing a normalization operation on the k to-be-detected sub-vectors, and the processor 501 being configured to respectively perform an inner product operation on the k to-be-detected sub-vectors and corresponding detection vectors among preset k detection vectors to obtain k first operation results is respectively performing the inner product operation on the k to-be-detected sub-vectors after the normalization operation and the corresponding detection vectors among the k detection vectors to obtain the k first operation results.

In an embodiment, the processor 501 is further configured to read the instruction stored in the memory 502 to perform the following method before the to-be-detected vector is segmented to obtain the k to-be-detected sub-vectors, constructing the data filter.

In an embodiment, the processor 501 being configured to construct the data filter is take N sample vectors, and perform the following steps for each sample vector of the N sample vectors segmenting the sample vector to obtain k sample sub-vectors, respectively performing an inner product operation on the k sample sub-vectors and corresponding detection vectors among the preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, and an identifier of a detection vector is in a one-to-one correspondence to a hash bucket, after the mapping of the N sample vectors is completed, respectively obtain values of the k hash buckets to determine, according to a value of a corresponding hash bucket, whether to filter out the to-be-detected vector, where a value of each hash bucket is a total quantity of sample vectors that are mapped to the hash bucket, and determine that the construction of the data filter is completed, where the data filter includes the k detection vectors, and the k hash buckets that respectively correspond to values of corresponding hash buckets.

In an embodiment, the processor 501 being configured to map the to-be-detected vector to a preset data filter according to the obtained identifier of the detection vector corresponding to the first operation result whose value is the maximum, and determine, using the data filter, whether to filter out the to-be-detected vector is mapping the to-be-detected vector to a particular hash bucket, and determining whether a value of the particular hash bucket is greater than a preset threshold, where the particular hash bucket is a hash bucket that is in the data filter and that corresponds to the identifier of the detection vector corresponding to the first operation result whose value is the maximum, and if the value of the particular hash bucket is greater than the preset threshold, determining to filter out the to-be-detected vector.

In an embodiment, the processor 501 is further configured to read the instruction stored in the memory 502 to perform the following method before the sample vector is segmented to obtain the k sample sub-vectors, obtain the k detection vectors from a particular distribution, and respectively perform a normalization operation on the k detection vectors such that L2 norms of the k detection vectors are 1, where the particular distribution meets that after a normalization operation is performed on any vector obtained from the particular distribution, an L2 norm of the any vector is 1.

In an embodiment, the processor 501 is further configured to read the instruction stored in the memory to perform the following method after the k sample sub-vectors are obtained, respectively performing a normalization operation on the k sample sub-vectors, and the processor 501 being configured to respectively perform an inner product operation on the k sample sub-vectors and corresponding detection vectors among the preset k detection vectors to obtain k second operation results is respectively performing the inner product operation on the k sample sub-vectors after the normalization operation and the corresponding detection vectors among the k detection vectors to obtain the k second operation results.

Figure 6:
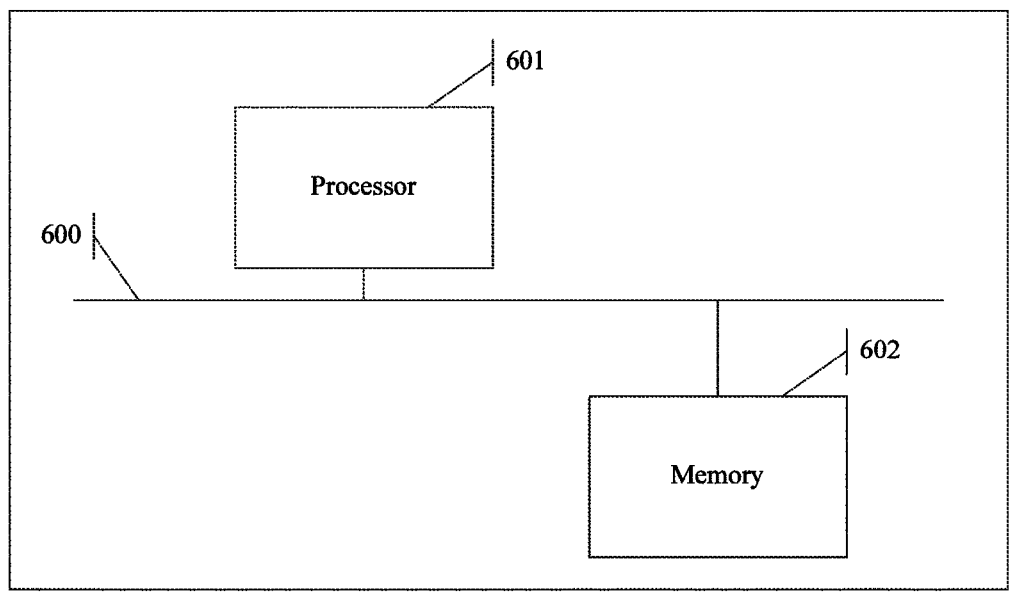
FIG. 6 is a main schematic structural diagram of an apparatus for constructing a data filter according to an embodiment of the present disclosure.

Referring to FIG. 6, an embodiment of the present disclosure provides an apparatus for constructing a data filter. The apparatus may include a processor 601 and memory 602 that are connected to a same bus 600. The memory 602 is configured to store an instruction needed by the processor 601 to execute a program, and the processor 601 is configured to read the instruction stored in the memory 602 to perform the following method taking N sample vectors, and performing the following steps for each sample vector of the N sample vectors segmenting the sample vector to obtain k sample sub-vectors, respectively performing an inner product operation on the k sample sub-vectors and corresponding detection vectors among preset k detection vectors to obtain k second operation results, determining a second operation result whose value is the maximum among the k first operation results and obtaining an identifier of a detection vector corresponding to the second operation result, and mapping the sample vector to a hash bucket corresponding to the obtained identifier of the detection vector corresponding to the second operation result whose value is the maximum, where one hash bucket is preset for each detection vector, a total of k hash buckets are preset, a detection vector is in a one-to-one correspondence to an identifier, and an identifier of a detection vector is also in a one-to-one correspondence to a hash bucket, after the mapping of the N sample vectors is completed, respectively obtain values of the k hash buckets to determine, according to a value of a corresponding hash bucket, whether to filter out the to-be-detected vector, where a value of each hash bucket is a total quantity of sample vectors that are mapped to the hash bucket, and determine that the construction of the data filter is completed, where the data filter includes the k detection vectors, and the k hash buckets that respectively correspond to values of corresponding hash buckets.

In an embodiment, the processor 601 is further configured to read the instruction stored in the memory 602 to perform the following method before the sample vector is segmented to obtain the k sample sub-vectors, obtaining the k detection vectors from a particular distribution, and respectively performing a normalization operation on the k detection vectors such that L2 norms of the k detection vectors are 1, where the particular distribution meets that after a normalization operation is performed on any vector obtained from the particular distribution, an L2 norm of the any vector is 1.

In an embodiment, the processor 601 is further configured to read the instruction stored in the memory 602 to perform the following method after the k sample sub-vectors are obtained, respectively performing a normalization operation on the k sample sub-vectors, and the processor 601 being configured to respectively perform particular operations on the k sample sub-vectors and corresponding detection vectors among preset k detection vectors to obtain k second operation results includes respectively performing the particular operation on the k sample sub-vectors after the normalization operation and the corresponding detection vectors among the k detection vectors to obtain the k second operation results.

The method for data filtering in the embodiments of the present disclosure may include segmenting a to-be-detected vector to obtain k to-be-detected sub-vectors, respectively performing an inner product operation on the k to-be-detected sub-vectors and corresponding detection vectors among preset k detection vectors to obtain k first operation results, determining a first operation result whose value is the maximum among the k first operation results and obtaining an identifier of a detection vector corresponding to the first operation result, where a detection vector is in a one-to-one correspondence to an identifier, and mapping the to-be-detected vector to a preset data filter according to the obtained identifier of the detection vector corresponding to the first operation result whose value is the maximum, and determining, using the data filter, whether to filter out the to-be-detected vector.

In an embodiment the to-be-detected vector is to-be-detected stream data, and detection is performed by segmenting the to-be-detected vector into multiple to-be-detected sub-vectors, which can ensure detection precision, and reduce calculation complexity. In addition, in the embodiments of the present disclosure, whether two vectors are similar is determined using an inner product, which is more accurate compared with using string matching, and which can also process data with higher complexity.

It may be clearly understood by a person skilled in the art that, for the purpose of convenient and brief description, division of the foregoing functional modules is taken as an example for illustration. In actual disclosure, the foregoing functions can be allocated to different functional modules and implemented according to a requirement, that is, an inner structure of an apparatus is divided into different functional modules to implement all or some of the functions described above. For a detailed working process of the foregoing system, apparatus, and unit, reference may be made to a corresponding process in the foregoing method embodiments, and details are not described herein again.

In the several embodiments provided in this disclosure, it should be understood that the disclosed system, apparatus, and method may be implemented in other manners. For example, the described apparatus embodiment is merely exemplary. For example, the module or unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of this disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this disclosure essentially, or the part contributing to the prior art, or all or some of the technical solutions may be implemented in the form of a software product. The computer software product is stored in a storage medium and includes several instructions for instructing a computer device (which may be a personal computer, a server, or a network device) or a processor to perform all or some of the steps of the methods described in the embodiments of this disclosure. The foregoing storage medium includes any medium that can store program code, such as a universal serial bus (USB) flash drive, a removable hard disk, a read-only memory (ROM), a random access memory (RAM), a magnetic disk, or an optical disc.

The foregoing embodiments are merely used to describe in detail the technical solutions of this disclosure. The descriptions of the foregoing embodiments are merely intended to help understand the method and the core idea of the present disclosure, and shall not be construed as a limitation to the present disclosure. Any variation or replacement readily figured out by a person skilled in the art within the technical scope disclosed in the present disclosure shall fall within the protection scope of the present disclosure.

What is claimed is:

1. A method for data filtering implemented by a device, comprising:
    segmenting, by a processor of the device, a to-be-detected vector to obtain k to-be-detected sub-vectors;
    respectively performing, by the processor, an inner product operation on the k to-be-detected sub-vectors and corresponding detection vectors among preset k detection vectors to obtain k first operation results;
    determining, by the processor, a first operation result, wherein a value of the first operation result is a maximum among the k first operation results;
    obtaining, by the processor, an identifier of a detection vector corresponding to the first operation result, wherein the detection vector corresponding to the first operation result is in a one-to-one correspondence to the identifier;
    mapping, by the processor, the to-be-detected vector to a preset data filter according to the identifier of the detection vector corresponding to the first operation result; and
    determining, by the processor and using the preset data filter, whether to filter out the to-be-detected vector.

2. The method according to claim 1, wherein after segmenting the to-be-detected vector to obtain the k to-be-detected sub-vectors, the method further comprises performing, by the processor, a normalization operation on each of the k to-be-detected sub-vectors, wherein respectively performing the inner product operation on the k to-be-detected sub-vectors and the corresponding detection vectors among the preset k detection vectors to obtain the k first operation results comprises respectively performing the inner product operation on the k to-be-detected sub-vectors after the normalization operation.

3. The method according to claim 1, wherein before segmenting the to-be-detected vector to obtain k to-be-detected sub-vectors, the method further comprises constructing, by the processor, the pre-set data filter.

4. The method according to claim 3, wherein constructing the pre-set data filter further comprises:
    taking, by the processor, N sample vectors;
    for each sample vector of the N sample vectors:
        segmenting, by the processor, the sample vector to obtain k sample sub-vectors;
        respectively performing, by the processor, a second inner product operation on the k sample sub-vectors and corresponding detection vectors among the pre-set k detection vectors to obtain k second operation results;
        determining, by the processor, a second operation result, wherein a value of the second operation result is the maximum among the k second operation results;
        obtaining, by the processor, an identifier of a detection vector corresponding to the second operation result; and
        mapping, by the processor, the sample vector to a hash bucket corresponding to the identifier of the detection vector corresponding to the second operation result, wherein one hash bucket is preset for each detection vector, wherein a total of k hash buckets are preset, and wherein an identifier of the detection vector corresponding to the second operation result is in a one-to-one correspondence to a hash bucket;
    respectively obtaining, by the processor, values of the k hash buckets to determine, according to a value of a corresponding hash bucket, whether to filter out the to-be-detected vector after the mapping of the N sample vectors is completed, wherein a value of each hash bucket is a total quantity of sample vectors that are mapped to the hash bucket; and
    determining, by the processor, that the construction of the preset data filter is completed, wherein the rest data filter comprises the k detection vectors, and wherein the k hash buckets that respectively correspond to values of corresponding hash buckets.

5. The method according to claim 4, wherein mapping the to-be-detected vector to the preset data filter according to the identifier of the detection vector corresponding to the first operation result and determining, using the preset data filter, whether to filter out the to-be-detected vector comprises:
    mapping, by the processor, the to-be-detected vector to a particular hash bucket;
    determining, by the processor, whether a value of the particular hash bucket is greater than a preset threshold, wherein the particular hash bucket is a hash bucket that is in the preset data filter and that corresponds to the identifier of the detection vector corresponding to the first operation result; and determining, by the processor, to filter out the to-be-detected vector when the value of the particular hash bucket is greater than the preset threshold.

6. The method according to claim 4, wherein before the segmenting the sample vector to obtain k sample sub-vectors, the method further comprises:
obtaining, by the processor, the k detection vectors from a particular distribution; and
respectively performing, by the processor, a normalization operation on the k detection vectors such that L2 norms of the k detection vectors are 1, and wherein the particular distribution meets a condition that an L2 norm of the any vector is 1 after a normalization operation is performed on any vector obtained from the particular distribution.

7. The method according to claim 4, wherein after the k sample sub-vectors are obtained, the method further comprises respectively performing, by the processor, a normalization operation on the k sample sub-vectors, and wherein respectively performing the inner product operation on the k sample sub-vectors and corresponding detection vectors among the preset k detection vectors to obtain the k second operation results comprises respectively performing, by the processor, the inner product operation on the k sample sub-vectors after the normalization operation.

8. A method for constructing a data filter implemented by an apparatus, comprising:
taking, by a processor of the apparatus, N sample vectors;
for each sample vector of the N sample vectors:
segmenting, by the processor, the sample vector to obtain k sample sub-vectors;
respectively performing, by the processor, an inner product operation on the k sample sub-vectors and corresponding detection vectors among preset k detection vectors to obtain k second operation results;
determining, by the processor, a second operation result, wherein a value of the second operation result is a maximum among the k second operation results;
obtaining, by the processor, an identifier of a detection vector corresponding to the second operation result; and
mapping, by the processor, the sample vector to a hash bucket corresponding to the identifier of the detection vector corresponding to the second operation result, wherein one hash bucket is preset for each detection vector, wherein a total of k hash buckets are preset, wherein the detection vector corresponding to the first operation result is in a one-to-one correspondence to an identifier, and wherein an identifier of a detection vector is also in a one-to-one correspondence to a hash bucket;
respectively obtaining, by the processor, values of the k hash buckets to determine, according to a value of a corresponding hash bucket, whether to filter out the to-be-detected vector after the mapping of the N sample vectors is completed, wherein a value of each hash bucket is a total quantity of sample vectors that are mapped to the hash bucket; and
determining, by the processor, that the construction of the data filter is completed, wherein the data filter comprises the k detection vectors, and wherein the k hash buckets that respectively correspond to values of corresponding hash buckets.

9. The method according to claim 8, wherein before segmenting the sample vector to obtain k sample sub-vectors, the method further comprises:
obtaining, by the processor, the k detection vectors from a particular distribution; and
respectively performing, by the processor, a normalization operation on the k detection vectors such that L2 norms of the k detection vectors are 1, and wherein the particular distribution meets a condition that after a normalization operation is performed on any vector obtained from the particular distribution, an L2 norm of the any vector is 1.

10. The method according to claim 8, wherein after the k sample sub-vectors are obtained, the method further comprises respectively performing a normalization operation on the k sample sub-vectors, wherein respectively performing the particular operation on the k sample sub-vectors and the corresponding detection vectors among the preset k detection vectors to obtain the k second operation results comprises respectively performing, by the processor, the particular operation on the k sample sub-vectors after the normalization operation.

11. An apparatus for data filtering, comprising:
a memory; and
a processor, wherein the memory is configured to store an instruction needed by the processor to execute a program, and wherein the processor is configured to read the instruction stored in the memory to perform the following method:
segmenting a to-be-detected vector to obtain k to-be-detected sub-vectors;
respectively performing an inner product operation on the k to-be-detected sub-vectors and corresponding detection vectors among preset k detection vectors to obtain k first operation results;
determining a first operation result, wherein a value of the first operation result is the maximum among the k first operation results;
obtaining an identifier of a detection vector corresponding to the first operation result, wherein the detection vector corresponding to the first operation result is in a one-to-one correspondence to the identifier,
mapping the to-be-detected vector to a preset data filter according to the identifier of the detection vector corresponding to the first operation result; and
determining, using the preset data filter, whether to filter out the to-be-detected vector.

12. The apparatus according to claim 11, wherein the processor is further configured to read the instruction stored in the memory to perform:
respectively performing a normalization operation on the k to-be-detected sub-vectors after the to-be-detected vector is segmented to obtain the k to-be-detected sub-vectors; and
respectively performing the inner product operation on the k to-be-detected sub-vectors after the normalization operation and the corresponding detection vectors among the k detection vectors to obtain the k first operation results.

13. The apparatus according to claim 11, wherein the processor is further configured to read the instruction stored in the memory to perform constructing the preset data filter before the to-be-detected vector is segmented to obtain the k to-be-detected sub-vectors.

14. The apparatus according to claim 13, wherein constructing the preset data filter further comprising:
taking N sample vectors;
for each sample vector of the N sample vectors:
segmenting the sample vector to obtain k sample sub-vectors;
respectively performing an inner product operation on the k sample sub-vectors and corresponding detection vectors among the preset k detection vectors to obtain k second operation results;
determining a second operation result, wherein a value of the second operation result is a maximum among the k first operation results;
obtaining an identifier of a detection vector corresponding to the second operation result; and
mapping the sample vector to a hash bucket corresponding to the identifier of the detection vector corresponding to the second operation result, wherein one hash bucket is preset for each detection vector, a total of k hash buckets are preset, and wherein an identifier of the detection vector corresponding to the second operation result is in a one-to-one correspondence to a hash bucket;
respectively obtaining values of the k hash buckets to determine, according to a value of a corresponding hash bucket, whether to filter out the to-be-detected vector after the mapping of the N sample vectors is completed, wherein a value of each hash bucket is a total quantity of sample vectors that are mapped to the hash bucket; and
determining that the construction of the preset data filter is completed, wherein the preset data filter comprises the k detection vectors, and wherein the k hash buckets that respectively correspond to values of corresponding hash buckets.

15. The apparatus according to claim 14, wherein mapping the to-be-detected vector to the preset data filter according to the identifier of the detection vector corresponding to the first operation result and determining, using the preset data filter, whether to filter out the to-be-detected vector further comprises:
mapping the to-be-detected vector to a particular hash bucket;
determining whether a value of the particular hash bucket is greater than a preset threshold, wherein the particular hash bucket is a hash bucket that is in the preset data filter and that corresponds to the identifier of the detection vector corresponding to the first operation result whose value is the maximum; and
determining to filter out the to-be-detected vector when the value of the particular hash bucket is greater than the preset threshold.

16. The apparatus according to claim 14, wherein the processor is further configured to read the instruction stored in the memory to perform:
obtaining the k detection vectors from a particular distribution before the sample vector is segmented to obtain the k sample sub-vectors; and
respectively performing a normalization operation on the k detection vectors such that L2 norms of the k detection vectors are 1, and wherein the particular distribution meets a condition that an L2 norm of the any vector is 1 after a normalization operation is performed on any vector obtained from the particular distribution.

17. The apparatus according to claim 14, wherein the processor is further configured to read the instruction stored in the memory to perform:
respectively performing a normalization operation on the k sample sub-vectors after the k sample sub-vectors are obtained; and
respectively performing the inner product operation on the k sample sub-vectors after the normalization operation and the corresponding detection vectors among the k detection vectors to obtain the k second operation results.

18. An apparatus for constructing a data filter, comprising:
a processor; and
a memory configured to store an instruction needed by the processor to execute a program, and wherein the processor is configured to read the instruction stored in the memory to perform:
taking N sample vectors;
for each sample vector of the N sample vectors:
segmenting the sample vector to obtain k sample sub-vectors;
respectively performing an inner product operation on the k sample sub-vectors and corresponding detection vectors among preset k detection vectors to obtain k second operation results;
determining a second operation result, wherein a value of the second operation result is a maximum among the k first operation results;
obtaining an identifier of a detection vector corresponding to the second operation result;
mapping the sample vector to a hash bucket corresponding to the identifier of the detection vector corresponding to the second operation result, wherein one hash bucket is preset for each detection vector, wherein a total of k hash buckets are preset, wherein the detection vector corresponding to the second operation result is in a one-to-one correspondence to an identifier, and wherein an identifier of a detection vector is also in a one-to-one correspondence to a hash bucket;
respectively obtain values of the k hash buckets to determine, according to a value of a corresponding hash bucket, whether to filter out the to-be-detected vector, after the mapping of the N sample vectors is completed wherein a value of each hash bucket is a total quantity of sample vectors that are mapped to the hash bucket; and
determine that the construction of the data filter is completed, wherein the data filter comprises the k detection vectors, and wherein the k hash buckets that respectively correspond to values of corresponding hash buckets.

19. The apparatus according to claim 18, wherein the processor is further configured to read the instruction stored in the memory to perform:
obtaining the k detection vectors from a particular distribution before the sample vector is segmented to obtain the k sample sub-vectors; and
respectively performing a normalization operation on the k detection vectors such that L2 norms of the k detection vectors are 1, wherein the particular distribution meets a criterion that, an L2 norm of the any vector is 1 after a normalization operation is performed on any vector obtained from the particular distribution.

20. The apparatus according to claim 18, wherein the processor is further configured to read the instruction stored in the memory to perform:

respectively performing a normalization operation on the k sample sub-vectors after the k sample sub-vectors are obtained; and respectively performing the particular operation on the k sample sub-vectors after the normalization operation and the corresponding detection vectors among the k detection vectors to obtain the k second operation results.

* * * * *